US009544685B2

(12) United States Patent
Wang

(10) Patent No.: US 9,544,685 B2
(45) Date of Patent: Jan. 10, 2017

(54) 5 GHZ WIRELESS STEREO SOUND SYSTEM

(71) Applicant: Fengshuo Wang, Zhejiang (CN)

(72) Inventor: Fengshuo Wang, Zhejiang (CN)

( * ) Notice: Subject to any disclaimer, the term of this patent is extended or adjusted under 35 U.S.C. 154(b) by 0 days.

(21) Appl. No.: 14/915,903

(22) PCT Filed: Apr. 21, 2014

(86) PCT No.: PCT/CN2014/075772
§ 371 (c)(1),
(2) Date: Mar. 2, 2016

(87) PCT Pub. No.: WO2015/139351
PCT Pub. Date: Sep. 24, 2015

(65) Prior Publication Data
US 2016/0212528 A1 Jul. 21, 2016

(30) Foreign Application Priority Data
Mar. 18, 2014 (CN) .......................... 2014 2 0119512

(51) Int. Cl.
H04B 5/00 (2006.01)
H04R 5/02 (2006.01)
H04R 3/00 (2006.01)
H04R 5/04 (2006.01)
G06F 3/16 (2006.01)
H03F 3/19 (2006.01)
H03F 3/21 (2006.01)
H03F 3/217 (2006.01)
H03F 3/24 (2006.01)
H03F 3/68 (2006.01)

(52) U.S. Cl.
CPC ................. *H04R 3/00* (2013.01); *G06F 3/165* (2013.01); *H03F 3/19* (2013.01); *H03F 3/211* (2013.01); *H03F 3/2175* (2013.01); *H03F 3/24* (2013.01); *H03F 3/245* (2013.01); *H03F 3/68* (2013.01); *H04R 5/04* (2013.01); *H03F 2200/03* (2013.01); *H03F 2200/451* (2013.01); *H04R 2400/00* (2013.01); *H04R 2420/03* (2013.01); *H04R 2420/07* (2013.01); *H04R 2420/09* (2013.01)

(58) Field of Classification Search
CPC ... H04R 3/00; H04R 2420/09; H04R 2420/03; G06F 3/165; H03F 3/24; H03F 3/211; H03F 3/2175; H03F 3/19
USPC .............................. 381/79, 307, 3, 4, 1, 300
See application file for complete search history.

(56) References Cited

U.S. PATENT DOCUMENTS

2010/0095342 A1* 4/2010 Gandhi .................. H04N 7/162
725/117

* cited by examiner

Primary Examiner — Thjuan K Addy

(57) ABSTRACT

A 5 GHz wireless stereo sound system having a transmitter and a receiver; the transmitter and the receiver are wirelessly connected via a 5 GHz signal. The 5 GHz wireless stereo sound system wirelessly transmits on a 5.2/5.8 GHz frequency in 24-bit/48K digital only, thereby avoiding interference from wireless devices that transmit on 2.4 GHz frequency band (including Bluetooth and personal area networks), infrared devices and so forth, thus solving the problems of mutual interference between conventional wireless devices and instability of signal transmission, thereby ensuring transmission stability.

8 Claims, 2 Drawing Sheets

5 GHZ WIRELESS STEREO SOUND SYSTEM

BACKGROUND OF THE INVENTION

The present invention belongs to the field of sound and more particularly pertains to a 5 GHz wireless stereo sound system.

Existing wireless audio technology usually involves two types, namely analog and digital audio. Wireless analog audio comprises FM (frequency modulation), AM (amplitude modulation), infrared and so forth. Analog audio signals are commonly susceptible to the problems of interference and instability. Wireless digital audio comprises Bluetooth, Wifi, Apple's AirPlay, Android DLNA and so forth, which belongs to the field of 2.4 GHz wireless audio technology.

2.4 GHz wireless audio technology solves the problems such as cabling difficulty and time-consuming issues, reduces installation and maintenance costs, and has wide application range, high bandwidth and low power consumption. However, due to a massive selection of 2.4 GHz (2.4-2.484 GHz) ISM band, the electromagnetic compatibility problem of this band is serious. Signals interfere with each other, resulting in pause or intermittence in wireless audio transmission.

In addition, most existing wireless audio systems adopt an integrated design which integrate wireless receiving, decoding and power amplification in speaker. Although the integration of the audio system simplifies the configuration of the audio system, it is impossible to select combination of components since all parts are integrated; it is also not possible to combine and form new desired systems.

BRIEF SUMMARY OF THE INVENTION

The present invention transmits on a 5.2/5.8 GHz frequency, thereby avoiding interference with wireless devices such as Bluetooth devices that transmits on the same 2.4 GHz frequency band in the same building, thus solving the problems of mutual interference and instability of signal transmission. By separating the wireless receiver out, the problem of the inability to freely combine with desired speakers for conventional wireless audio systems is solved. The wireless receiver of the present invention integrates wireless receiving, decoding and power amplification. The amplifier is equipped with ICEpower Class D modules. Desired speakers can be freely combined, thus applicability is wide.

In view of the aforesaid problems, the present invention provides a 5 GHz wireless stereo sound system.

The technical solutions adopted by the present invention to solve the aforesaid problems are as follows: A 5 GHz wireless stereo sound system comprises a transmitter and a receiver; the transmitter and the receiver are wirelessly connected via a 5 GHz signal; the transmitter comprises an input interface unit, a digital audio processing unit, a 5 GHz wireless transmission unit, a system power supply unit, an LED display unit and a key control and infrared remote control unit; an output end of the input interface unit connects to the digital audio processing unit; an output end of the digital audio processing unit connects to the 5 GHz wireless transmission unit; output ends of the system power supply unit connects to the digital audio processing unit and the 5 GHz wireless transmission unit respectively; an input end of the LED display unit connects to the 5 GHz wireless transmission unit; an output end of the key control and infrared remote control unit connects to the 5 GHz wireless transmission unit.

Further, the input interface unit comprises a USB interface, an optical fiber interface, a coaxial interface and an analog audio interface; the USB interface, the optical fiber interface, the coaxial interface and the analog audio interface connect to the digital audio processing unit respectively.

Further, the digital audio processing unit comprises a USB processor, a 24-bit digital-to-analog converter, an audio data input selection and I2S output unit, and a sample rate converter; an output end of the USB processor connects to the audio data input selection and I2S output unit; an output end of the 24-bit digital-to-analog converter connects to the audio data input selection and I2S output unit; an output end of the audio data input selection and I2S output unit connects to the sample rate converter; an output end of the sample rate converter connects to the 5 GHz wireless transmission unit.

Further, the 5 GHz wireless transmission unit comprises a first base band unit, a first radio frequency unit and a first built-in dual-band antenna; the first base band unit bi-directionally and electrically connects to the first radio frequency unit; the first built-in dual-band antenna connects to the first radio frequency unit.

Further, the receiver comprises a power amplifier unit, a DAC and analog output unit, a 5 GHz wireless receiving unit, a 220V AC input unit, and an AC to DC unit; output ends of the 220V AC input unit connect to the power amplifier unit and the AC to DC unit respectively; output ends of the AC to DC unit connect to the DAC and analog output unit and the 5 GHz wireless receiving unit respectively; an output end of the 5 GHz wireless receiving unit connects to the DAC and analog output unit; an output end of the DAC and analog output unit connects to the power amplifier unit.

Further, the power amplifier unit comprises a dual-channel 100 W power amplifier module, a mono-channel 200 W power amplifier module, a first left-channel speaker, a first right-channel speaker and a second speaker; the dual-channel 100 W power amplifier module connects to the first left-channel speaker and the first right-channel speaker respectively; the mono-channel 200 W power amplifier module connects to the second speaker.

Further, the DAC and analog output unit comprises a left-right channel interface, an analog low-pass filter and buffer unit, a 24-bit 192 KHzDAC unit and a left-right channel switch; an output end of the left-right channel switch connects to the 24-bit 192 KHzDAC unit; a left channel output end and a right channel output end of the 24-bit 192 KHzDAC unit connect to the analog low-pass filter and buffer unit respectively; a left channel output end and a right channel output end of the analog low-pass filter and buffer unit connect to the left-right channel interface respectively; an output end of left-right channel interface connects to the power amplifier unit.

Further, the 5 GHz wireless receiving unit comprises a second base band unit, a second radio frequency unit and a second built-in dual-band antenna; the second base band unit bi-directionally and electrically connects to the second radio frequency unit; the second built-in dual-band antenna connects to the second radio frequency unit.

The present invention has the following advantages:

1. The present invention wirelessly transmits on a 5.2/5.8 GHz frequency in 24-bit/48 K digital only, thereby avoiding interference from wireless devices that transmit on 2.4 GHz frequency band (including Bluetooth and personal area networks, thus solving the problems of mutual interference between conventional wireless devices and instability of signal transmission, thereby ensuring transmission stability.

2. Each set of product comprises two parts, namely a wireless transmitter and a wireless receiver. The wireless transmitter can directly receive digital audio signals from an audio equipment or a computer via coaxial cables, optical fibers or USB, or receive analog audio signals via RCA interface and digitize the signals via ADC. The wireless transmitter can be used in combination with any one of the wireless receivers. One wireless transmitter can connect up to eight receivers simultaneously. The present set of product is applicable in domestic and professional audio applications such as home theaters, stereo systems, recording and live concerts, etc.

3. The present product achieves high-quality sound performance. The wireless transmitter signals are transmitted in 24-bit/48K precision digital only, and with the application of FIFO buffer technology and digital PLL, a low jitter which cannot be measured in the digital domain can be achieved. The wireless receiver integrates wireless receiving, decoding and power amplification, and is equipped with ICEpower Class D amplifier modules, ensuring high-fidelity audio performance.

4. The present invention separates the wireless receiver out, solving the problem of the inability to freely combine with desired speakers for conventional wireless audio systems. The wireless receiver of the present invention integrates wireless receiving, decoding and power amplification. The amplifier is equipped with ICEpower Class D modules. Desired speakers can be freely combined, thus applicability is wide.

In addition to the objectives, characteristics and advantages described above, the present invention also has other objectives, characteristics and advantages. The present invention is described in further detail below with reference to the accompanying drawings.

BRIEF DESCRIPTION OF THE DRAWINGS

The drawings which constitute a part of the present application are used to provide a further understanding to the present invention. An exemplary embodiment of the present invention and the description thereof serve to explain the present invention and do not constitute any limitation on the present invention.

DETAILED DESCRIPTION OF THE INVENTION

To further clarify the objectives, technical solutions, and advantages of the present invention, the present invention is further described in detail below with reference to the accompanying drawings and embodiment. It should be appreciated that the detailed embodiment described below is only used to explain the present invention without limiting the present invention.

Figure 1:
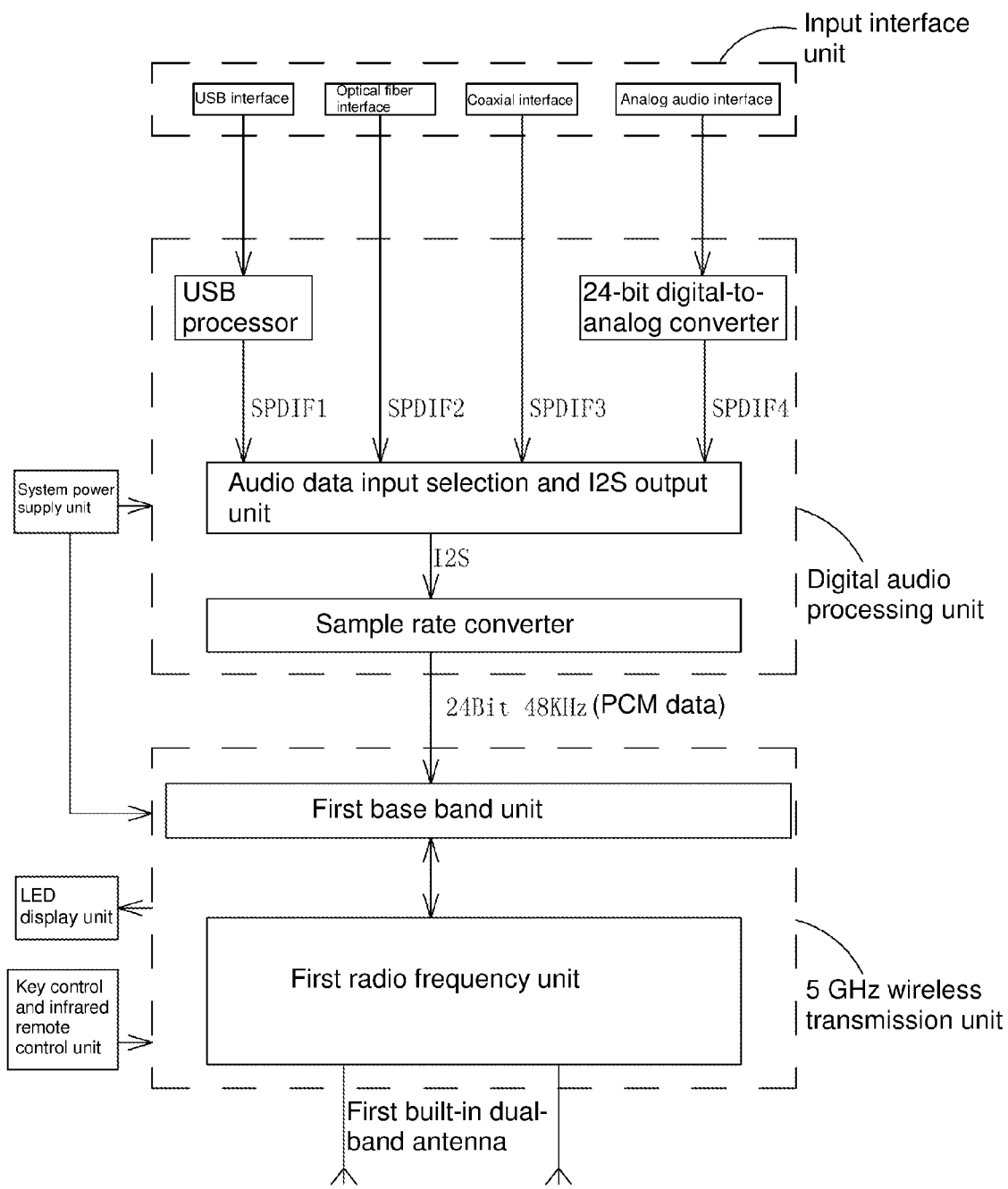
FIG. 1 is a block diagram of a transmitter of an embodiment of the present invention.
Figure 2:
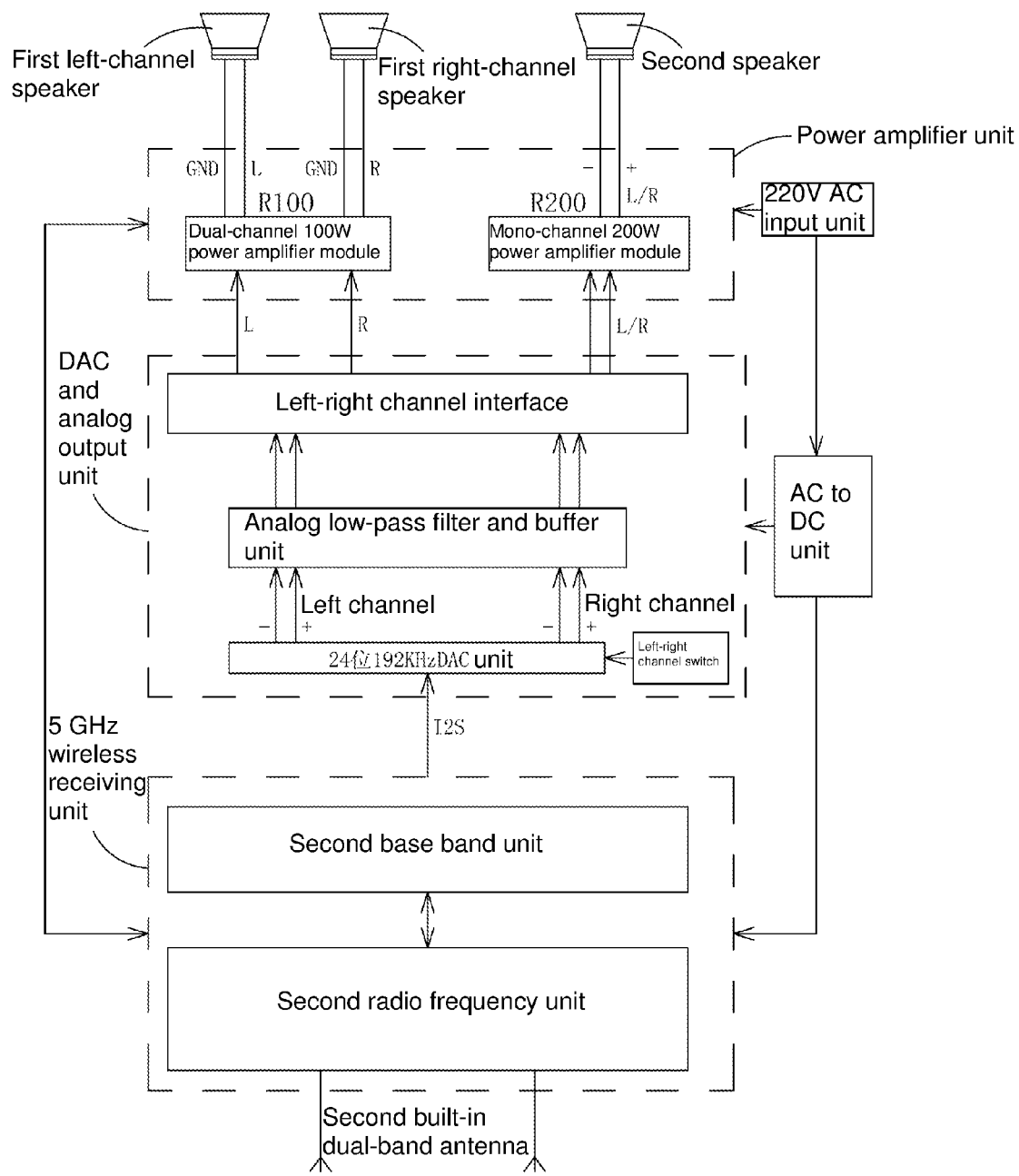
FIG. 2 is a block diagram of a receiver of an embodiment of the present invention.

As illustrated in FIGS. 1 and 2, a 5 GHz wireless stereo sound system of the present invention comprises a transmitter and a receiver; the transmitter and the receiver are wirelessly connected via a 5 GHz signal.

The transmitter comprises an input interface unit, a digital audio processing unit, a 5 GHz wireless transmission unit, a system power supply unit, an LED display unit and a key control and infrared remote control unit; an output end of the input interface unit connects to the digital audio processing unit; an output end of the digital audio processing unit connects to the 5 GHz wireless transmission unit; output ends of the system power supply unit connects to the digital audio processing unit and the 5 GHz wireless transmission unit respectively; an input end of the LED display unit connects to the 5 GHz wireless transmission unit; an output end of the key control and infrared remote control unit connects to the 5 GHz wireless transmission unit.

The input interface unit comprises a USB interface, an optical fiber interface, a coaxial interface and an analog audio interface; the USB interface, the optical fiber interface, the coaxial interface and the analog audio interface connect to the digital audio processing unit respectively. The USB interface, the optical fiber interface, the coaxial interface and the analog audio interface all support 192K/24 Bit digital audio signal input.

The digital audio processing unit comprises a USB processor, a 24-bit digital-to-analog converter, an audio data input selection and I2S output unit, and a sample rate converter; an output end of the USB processor connects to the audio data input selection and I2S output unit; an output end of the 24-bit digital-to-analog converter connects to the audio data input selection and I2S output unit; an output end of the audio data input selection and I2S output unit connects to the sample rate converter; an output end of the sample rate converter connects to the 5 GHz wireless transmission unit. The sample rate converter locks the signal sampling rate at 48 K for ease of wireless processing of different signal sources.

The 5 GHz wireless transmission unit comprises a first base band unit, a first radio frequency unit and a first built-in dual-band antenna; the first base band unit bi-directionally and electrically connects to the first radio frequency unit; the first built-in dual-band antenna connects to the first radio frequency unit.

The receiver comprises a power amplifier unit, a DAC and analog output unit, a 5 GHz wireless receiving unit, a 220V AC input unit, and an AC to DC unit; output ends of the 220V AC input unit connect to the power amplifier unit and the AC to DC unit respectively; output ends of the AC to DC unit connect to the DAC and analog output unit and the 5 GHz wireless receiving unit respectively; an output end of the 5 GHz wireless receiving unit connects to the DAC and analog output unit; an output end of the DAC and analog output unit connects to the power amplifier unit.

The power amplifier unit comprises a dual-channel 100 W power amplifier module, a mono-channel 200 W power amplifier module, a first left-channel speaker, a first right-channel speaker and a second speaker; the dual-channel 100 W power amplifier module connects to the first left-channel speaker and the first right-channel speaker respectively; the mono-channel 200 W power amplifier module connects to the second speaker.

The DAC and analog output unit comprises a left-right channel interface, an analog low-pass filter and buffer unit, a 24-bit 192 KHzDAC unit and a left-right channel switch; an output end of the left-right channel switch connects to the 24-bit 192 KHzDAC unit; a left channel output end and a right channel output end of the 24-bit 192 KHzDAC unit connect to the analog low-pass filter and buffer unit respectively; a left channel output end and a right channel output end of the analog low-pass filter and buffer unit connect to the left-right channel interface respectively; an output end of left-right channel interface connects to the power amplifier unit.

The 5 GHz wireless receiving unit comprises a second base band unit, a second radio frequency unit and a second built-in dual-band antenna; the second base band unit bi-directionally and electrically connects to the second radio frequency unit; the second built-in dual-band antenna connects to the second radio frequency unit.

The receiver controls volume in the digital domain, which ensures volume control has minimal impact on system performance. The first base band unit and the second base band unit achieve 24 Bit processing precision and precision in wireless transmission, and ensure no loss in high-performance audio signal transmission; with the integration of digital PLL, the transmitter and the receiver are ensured to work simultaneously; with the integration of FIFO (first-in first-out buffer), asynchronous technology is used to ensure the characteristic of a low time base error (low jitter) of the system. The first radio frequency unit and the second radio frequency unit support 5.2 GHz/5.8 GHz automatic dual-point frequency hopping and AGC (automatic gain control). For instance, when 5.2 GHz is interfered, it will jump to 5.8 GHz to avoid interference. If the transmission distance increases, the radio frequency unit will automatically increase the transmission power, and vice versa.

The transmitter and the receiver both support bidirectional communication. The receiver also continuously feeds back status to the transmitter, so that the transmitter can adjust the transmission power, retransmit data packet when interfered, and even change the system operating frequency to ensure system stability.

The mono version receiver can be freely made into left or right channel by a small switch.

The power amplifier uses the ICEpower Class D amplifier module. By switching to a different module, different output power can be obtained.

The embodiment of the present invention solves the problems of mutual interference and instability of signal transmission of conventional wireless devices by transmitting on a 5.2/5.8 GHz frequency. Each system of the 5 GHz wireless stereo sound system consists of two parts, namely a transmitter and a receiver. The wireless transmitter can be used in combination with any one of the wireless receivers. One transmitter can receive up to eight receivers simultaneously. The wireless transmitter can directly receive digital audio signals from an audio equipment or a computer via coaxial cables, optical fibers or USB, or receive analog audio signals via RCA interface and digitize the signals via the ADC. Transmitter signals are transmitted in 24-bit/48 K precision digital only, and with the application of FIFO buffer technology and digital PLL, a low jitter can be achieved, thus ensuring audio performance. The wireless power amplifier integrates wireless receiving, decoding and power amplification, and is equipped with ICEpower Class D amplifier modules, wherein the stereo wireless power amplifier output is 50 W×2 and can connect to the audio. The wireless power amplifier of the mono-channel has an output power of 200 W and a current output of 20 A. The switch at the back can set left channel or right channel. One transmitter is required to be used with a pair of mono channel wireless power amplifiers.

The present invention wirelessly transmits on a 5.2/5.8 GHz frequency in 24-bit/48 K digital only, thereby avoiding interference from wireless devices that transmit on 2.4 GHz frequency band (including Bluetooth and personal area networks), infrared devices and so forth, thus solving the problems of mutual interference between conventional wireless devices and instability of signal transmission, thereby ensuring transmission stability.

The above description is only a preferred embodiment of the present invention, and is not intended to limit the present invention. Any modification, equivalent replacement and improvement made within the spirit and principles of the present invention should be within the scope of protection of the present invention.

What is claimed is:

1. A 5 GHz wireless stereo sound system, characterized in that it comprises a transmitter and a receiver; the transmitter and the receiver are wirelessly connected via a 5 GHz signal; the transmitter comprises an input interface unit, a digital audio processing unit, a 5 GHz wireless transmission unit, a system power supply unit, an LED display unit and a key control and infrared remote control unit; an output end of the input interface unit connects to the digital audio processing unit; an output end of the digital audio processing unit connects to the 5 GHz wireless transmission unit; output ends of the system power supply unit connect to the digital audio processing unit and the 5 GHz wireless transmission unit respectively; an input end of the LED display unit connects to the 5 GHz wireless transmission unit; an output end of the key control and infrared remote control unit connects to the 5 GHz wireless transmission unit.

2. The 5 GHz wireless stereo sound system as described in claim 1, characterized in that the input interface unit comprises a USB interface, an optical fiber interface, a coaxial interface and an analog audio interface; the USB interface, the optical fiber interface, the coaxial interface and the analog audio interface connect to the digital audio processing unit respectively.

3. The 5 GHz wireless stereo sound system as described in claim 1, characterized in that the digital audio processing unit comprises a USB processor, a 24-bit digital-to-analog converter, an audio data input selection and I2S output unit, and a sample rate converter; an output end of the USB processor connects to the audio data input selection and I2S output unit; an output end of the 24-bit digital-to-analog converter connects to the audio data input selection and I2S output unit; an output end of the audio data input selection and I2S output unit connects to the sample rate converter; an output end of the sample rate converter connects to the 5 GHz wireless transmission unit.

4. The 5 GHz wireless stereo sound system as described in claim 1, characterized in that the 5 GHz wireless transmission unit comprises a first base band unit, a first radio frequency unit and a first built-in dual-band antenna; the first base band unit bi-directionally and electrically connects to the first radio frequency unit; the first built-in dual-band antenna connects to the first radio frequency unit.

5. The 5 GHz wireless stereo sound system as described in claim 1, characterized in that the receiver comprises a power amplifier unit, a DAC and analog output unit, a 5 GHz wireless receiving unit, a 220V AC input unit, and an AC to DC unit; output ends of the 220V AC input unit connect to the power amplifier unit and the AC to DC unit respectively; output ends of the AC to DC unit connect to the DAC and analog output unit and the 5 GHz wireless receiving unit respectively; an output end of the 5 GHz wireless receiving unit connects to the DAC and analog output unit; an output end of the DAC and analog output unit connects to the power amplifier unit.

6. The 5 GHz wireless stereo sound system as described in claim 5, characterized in that the power amplifier unit comprises a dual-channel 100 W power amplifier module, a mono-channel 200 W power amplifier module, a first left-channel speaker, a first right-channel speaker and a second speaker; the dual-channel 100 W power amplifier module connects to the first left-channel speaker and the first right-channel speaker respectively; the mono-channel 200 W power amplifier module connects to the second speaker.

7. The 5 GHz wireless stereo sound system as described in claim 5, characterized in that the DAC and analog output unit comprises a left-right channel interface, an analog low-pass filter and buffer unit, a 24-bit 192 KHzDAC unit and a left-right channel switch; an output end of the left-right channel switch connects to the 24-bit 192 KHzDAC unit; a left channel output end and a right channel output end of the 24-bit 192 KHzDAC unit connect to the analog low-pass filter and buffer unit respectively; a left channel output end and a right channel output end of the analog low-pass filter and buffer unit connect to the left-right channel interface respectively; an output end of left-right channel interface connects to the power amplifier unit.

8. The 5 GHz wireless stereo sound system as described in claim 5, characterized in that the 5 GHz wireless receiving unit comprises a second base band unit, a second radio frequency unit and a second built-in dual-band antenna; the second base band unit bi-directionally and electrically connects to the second radio frequency unit; the second built-in dual-band antenna connects to the second radio frequency unit.

* * * * *